United States Patent
Malik et al.

(10) Patent No.: US 11,689,410 B2
(45) Date of Patent: Jun. 27, 2023

(54) DPD TRAINING AND CALIBRATION

(71) Applicant: QUALCOMM Incorporated, San Diego, CA (US)

(72) Inventors: Rahul Malik, San Diego, CA (US); Timo Ville Vintola, San Diego, CA (US); Alexei Yurievitch Gorokhov, San Diego, CA (US); Raghu Narayan Challa, San Diego, CA (US); Shrenik Patel, San Diego, CA (US); Tao Luo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 24 days.

(21) Appl. No.: 17/456,148

(22) Filed: Nov. 22, 2021

(65) Prior Publication Data

US 2023/0164018 A1    May 25, 2023

(51) Int. Cl.
*H03F 1/32* (2006.01)
*H04L 27/36* (2006.01)
*H04W 72/21* (2023.01)
*H04W 72/23* (2023.01)

(52) U.S. Cl.
CPC ........... *H04L 27/367* (2013.01); *H04W 72/21* (2023.01); *H04W 72/23* (2023.01); *H03F 1/3247* (2013.01)

(58) Field of Classification Search
CPC ... H04L 67/12; H04L 1/0041; H04L 67/1097; H04L 1/18; H04L 5/0064; H04L 1/0002; H04L 1/0009; H04B 17/309; H04B 17/318; H04B 17/29; H04B 17/345; H04B 17/40; H04B 17/23; H04B 17/26; H03F 1/3247; H03F 2200/451; H03F 3/24; H03F 1/3241; H03F 3/245; H03F 2201/3233; H03F 1/3258; H03F 3/189; H03F 3/19
USPC ......................................................... 375/296
See application file for complete search history.

(56) References Cited

U.S. PATENT DOCUMENTS

| | | | |
|---|---|---|---|
| 9,232,541 B2* | 1/2016 | Lee .................. | H04W 74/08 |
| 2015/0270813 A1* | 9/2015 | Morshedi ............ | H04B 1/0458 |
| | | | 455/144 |
| 2019/0222326 A1* | 7/2019 | Dunworth .............. | H04B 1/04 |
| 2022/0360283 A1* | 11/2022 | Gutman ............... | H04B 1/0475 |
| 2023/0014042 A1* | 1/2023 | Barak .................... | H04B 17/13 |

* cited by examiner

*Primary Examiner* — Eva Y Puente
(74) *Attorney, Agent, or Firm* — Procopio, Cory, Hargreaves & Savitch LLP

(57) ABSTRACT

Methods, apparatuses, and computer-readable medium for DPD are provided. An example method may include receiving, from a base station, an uplink grant associated with one or more resources. The example method may further include transmitting, to the UE via the one or more resources, a DPD training signal at a first port of a plurality of ports. The example method may further include receiving, at a second port of the plurality of ports, the DPD training signal.

30 Claims, 9 Drawing Sheets

DPD TRAINING AND CALIBRATION

TECHNICAL FIELD

The present disclosure relates generally to communication systems, and more particularly, to wireless communication systems with digital pre-distortion (DPD).

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

BRIEF SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus at a user equipment (UE) are provided. The apparatus may include a memory and at least one processor coupled to the memory. The memory and the at least one processor coupled to the memory may be configured to receive, from a base station, an uplink grant associated with one or more resources. The memory and the at least one processor coupled to the memory may be further configured to transmit, to the UE via the one or more resources, a DPD training signal at a first port of a plurality of ports. The memory and the at least one processor coupled to the memory may be further configured to receive, at a second port of the plurality of ports, the DPD training signal.

In another aspect of the disclosure, a method, a computer-readable medium, and an apparatus at a base station are provided. The apparatus may include a memory and at least one processor coupled to the memory. The memory and the at least one processor coupled to the memory may be configured to schedule one or more resources as a downlink grant. The memory and the at least one processor coupled to the memory may be further configured to transmit, to the base station via the one or more resources, a DPD training signal at a first port of a plurality of ports. The memory and the at least one processor coupled to the memory may be further configured to receive, at a second port of the plurality of ports, the DPD training signal.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
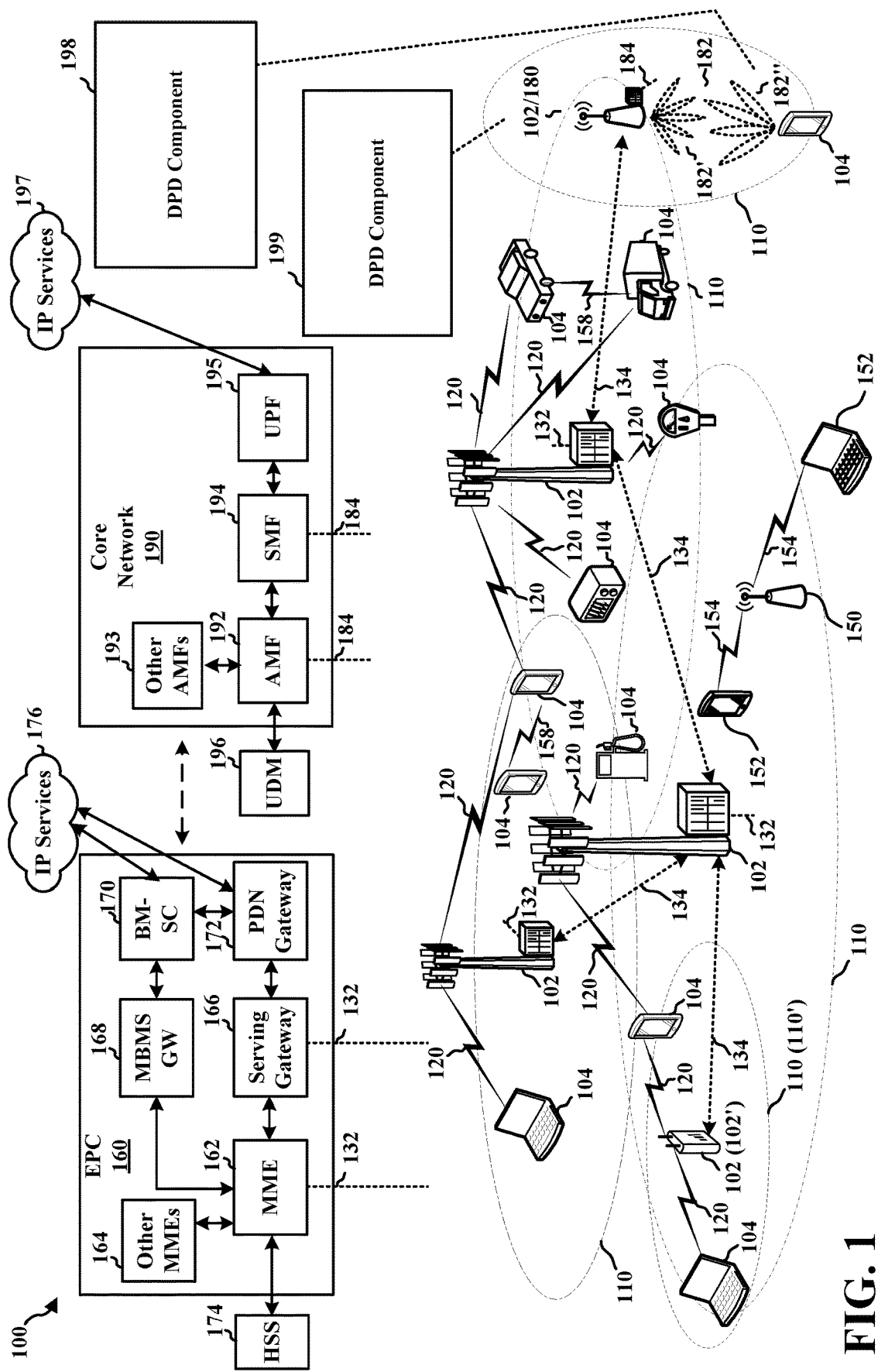
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the types of computer-readable media, or any other medium that can be used to store computer executable code in the form of instructions or data structures that can be accessed by a computer.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, and packaging arrangements. For example, implementations and/or uses may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also include additional components and features for implementation and practice of claimed and described aspect. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, aggregated or disaggregated components, end-user devices, etc. of varying sizes, shapes, and constitution.

FIG. 1 is a diagram illustrating an example of a wireless communications system and an access network 100. The wireless communications system (also referred to as a wireless wide area network (WWAN)) includes base stations 102, UEs 104, an Evolved Packet Core (EPC) 160, and another core network 190 (e.g., a 5G Core (5GC)). The base stations 102 may include macrocells (high power cellular base station) and/or small cells (low power cellular base station). The macrocells include base stations. The small cells include femtocells, picocells, and microcells.

The base stations 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., S1 interface). The base stations 102 configured for 5G NR (collectively referred to as Next Generation RAN (NG-RAN)) may interface with core network 190 through second backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or core network 190) with each other over third backhaul links 134 (e.g., X2 interface). The first backhaul links 132, the second backhaul links 184, and the third backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, WiMedia, Bluetooth, ZigBee, Wi-Fi based on the Institute of Electrical and Electronics Engineers (IEEE) 802.11 standard, LTE, or NR.

The wireless communications system may further include a Wi-Fi access point (AP) 150 in communication with Wi-Fi stations (STAs) 152 via communication links 154, e.g., in a 5 GHz unlicensed frequency spectrum or the like. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same unlicensed frequency spectrum (e.g., 5 GHz, or the like) as used by the Wi-Fi AP 150. The small cell 102', employing NR in an unlicensed frequency spectrum, may boost coverage to and/or increase capacity of the access network.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR2-2 (52.6 GHz-71 GHz), FR4 (52.6 GHz-114.25 GHz), and FR5 (114.25 GHz-300 GHz). Each of these higher frequency bands falls within the EHF band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, FR4, FR2-2, and/or FR5, or may be within the EHF band.

A base station 102, whether a small cell 102' or a large cell (e.g., macro base station), may include and/or be referred to as an eNB, gNodeB (gNB), or another type of base station. Some base stations, such as gNB 180 may operate in a traditional sub 6 GHz spectrum, in millimeter wave frequencies, and/or near millimeter wave frequencies in communication with the UE 104. When the gNB 180 operates in millimeter wave or near millimeter wave frequencies, the gNB 180 may be referred to as a millimeter wave base station. The millimeter wave base station 180 may utilize beamforming 182 with the UE 104 to compensate for the path loss and short range. The base station 180 and the UE 104 may each include a plurality of antennas, such as antenna elements, antenna panels, and/or antenna arrays to facilitate the beamforming.

The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include an Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a Packet Switch (PS) Streaming (PSS) Service, and/or other IP services.

The base station may include and/or be referred to as a gNB, Node B, eNB, an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. In some scenarios, the term UE may also apply to one or more companion devices such as in a device constellation arrangement. One or more of these devices may collectively access the network and/or individually access the network.

Referring again to FIG. 1, in some aspects, the UE 104 may include a DPD component 198. In some aspects, the DPD component 198 may be configured to receive, from a base station, an uplink grant associated with one or more resources. In some aspects, the DPD component 198 may be further configured to transmit, to the UE via the one or more resources, a DPD training signal at a first port of a plurality of ports. In some aspects, the DPD component 198 may be further configured to receive, at a second port of the plurality of ports, the DPD training signal.

In certain aspects, the base station 180 may include a DPD component 199. In some aspects, the DPD component 199 may be configured to schedule one or more resources as a downlink grant. In some aspects, the DPD component 199 may be further configured to transmit, to the base station via the one or more resources, a DPD training signal at a first port of a plurality of ports. In some aspects, the DPD component 199 may be further configured to receive, at a second port of the plurality of ports, the DPD training signal.

Although the following description may be focused on 5G NR, the concepts described herein may be applicable to other similar areas, such as LTE, LTE-A, CDMA, GSM, and other wireless technologies.

Figure 2:
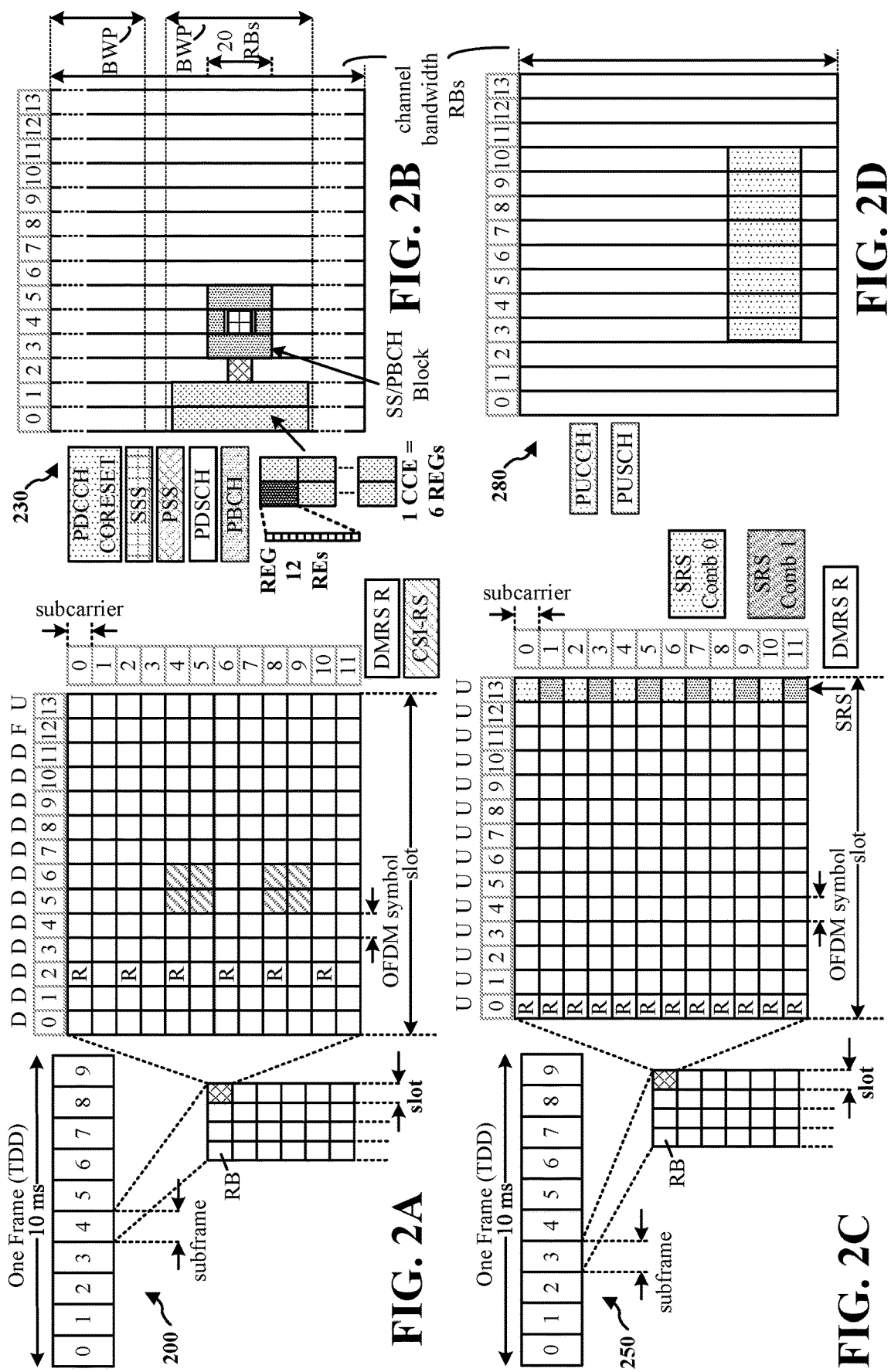
FIG. 2A is a diagram illustrating an example of a first frame, in accordance with various aspects of the present disclosure.
FIG. 2B is a diagram illustrating an example of DL channels within a subframe, in accordance with various aspects of the present disclosure.
FIG. 2C is a diagram illustrating an example of a second frame, in accordance with various aspects of the present disclosure.
FIG. 2D is a diagram illustrating an example of UL channels within a subframe, in accordance with various aspects of the present disclosure.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 1 (with all UL). While subframes 3, 4 are shown with slot formats 1, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G NR frame structure that is TDD.

FIGS. 2A-2D illustrate a frame structure, and the aspects of the present disclosure may be applicable to other wireless communication technologies, which may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 14 or 12 symbols, depending on whether the cyclic prefix (CP) is normal or extended. For normal CP, each slot may include 14 symbols, and for extended CP, each slot may include 12 symbols. The symbols on DL may be CP orthogonal frequency division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the CP and the numerology. The numerology defines the subcarrier spacing (SCS) and, effectively, the symbol length/duration, which is equal to 1/SCS.

| μ | SCS<br>$\Delta f = 2^\mu \cdot 15$ [kHz] | Cyclic prefix |
|---|---|---|
| 0 | 15 | Normal |
| 1 | 30 | Normal |
| 2 | 60 | Normal, Extended |
| 3 | 120 | Normal |
| 4 | 240 | Normal |

For normal CP (14 symbols/slot), different numerologies μ 0 to 4 allow for 1, 2, 4, 8, and 16 slots, respectively, per subframe. For extended CP, the numerology 2 allows for 4 slots per subframe. Accordingly, for normal CP and numerology μ, there are 14 symbols/slot and $2^\mu$ slots/subframe. The subcarrier spacing may be equal to $2^\mu * 15$ kHz, where μ is the numerology 0 to 4. As such, the numerology μ=0 has a subcarrier spacing of 15 kHz and the numerology μ=4 has a subcarrier spacing of 240 kHz. The symbol length/duration is inversely related to the subcarrier spacing. FIGS. 2A-2D provide an example of normal CP with 14 symbols per slot and numerology μ=2 with 4 slots per subframe. The slot duration is 0.25 ms, the subcarrier spacing is 60 kHz, and the symbol duration is approximately 16.67 μs. Within a set of frames, there may be one or more different bandwidth parts (BWPs) (see FIG. 2B) that are frequency division multiplexed. Each BWP may have a particular numerology and CP (normal or extended).

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as R for one particular configuration, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs) (e.g., 1, 2, 4, 8, or 16 CCEs), each CCE including six RE groups (REGs), each REG including 12 consecutive REs in an OFDM symbol of an RB. A PDCCH within one BWP may be referred to as a control resource set (CORESET). A UE is configured to monitor PDCCH candidates in a PDCCH search space (e.g., common search space, UE-specific search space) during PDCCH monitoring occasions on the CORESET, where the PDCCH candidates have different DCI formats and different aggregation levels. Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgment (ACK) (HARQ-ACK) feedback (i.e., one or more HARQ ACK bits indicating one or more ACK and/or negative ACK (NACK)). The PUSCH carries data, and may additionally be used to carry a buffer status report (BSR), a power headroom report (PHR), and/or UCI.

Figure 3:
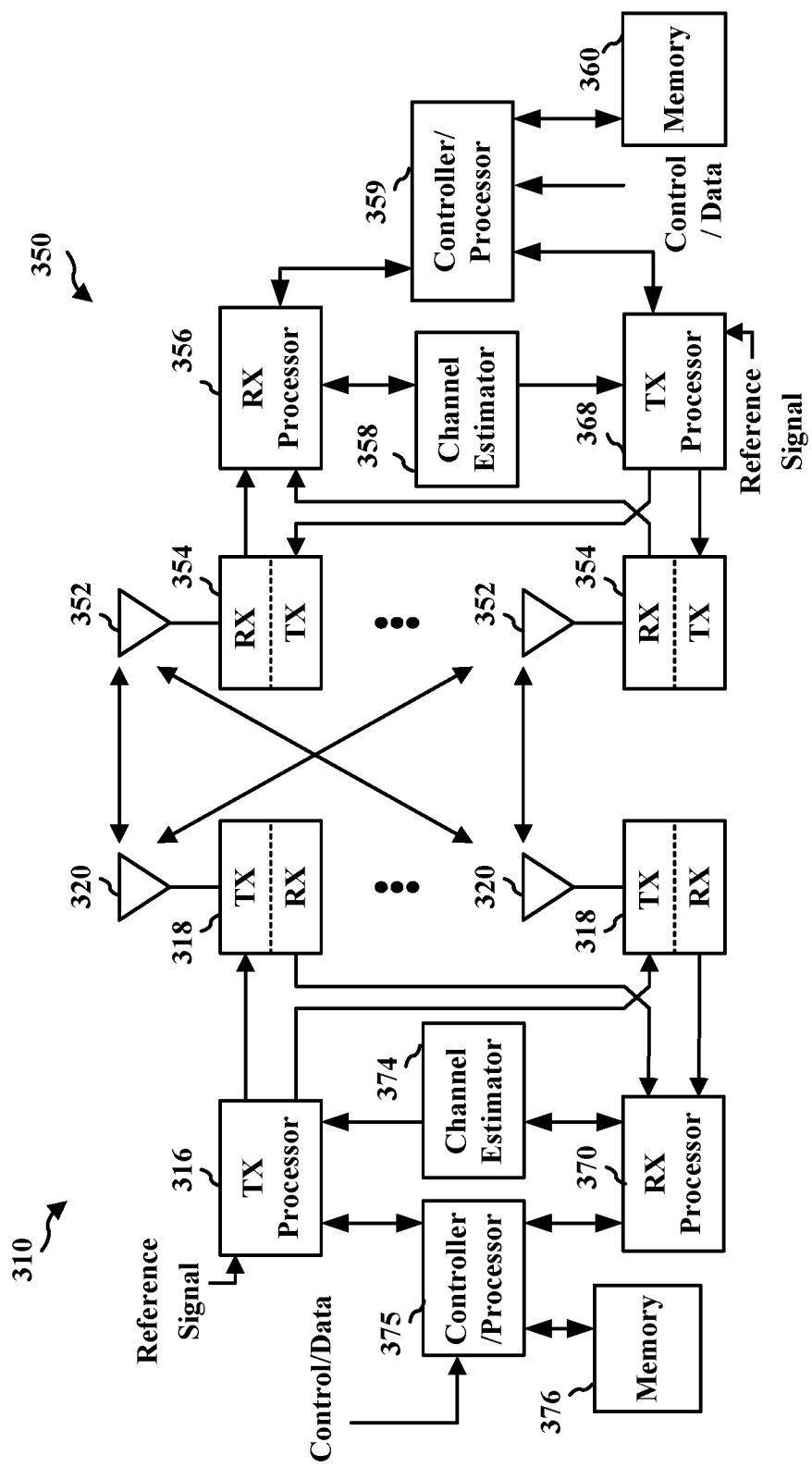
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318 TX. Each transmitter 318 TX may modulate a radio frequency (RF) carrier with a respective spatial stream for transmission.

At the UE 350, each receiver 354 RX receives a signal through its respective antenna 352. Each receiver 354 RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

At least one of the TX processor 368, the RX processor 356, and the controller/processor 359 may be configured to perform aspects in connection with DPD component 198 of FIG. 1.

At least one of the TX processor 316, the RX processor 370, and the controller/processor 375 may be configured to perform aspects in connection with DPD component 199 of FIG. 1.

Figure 4:
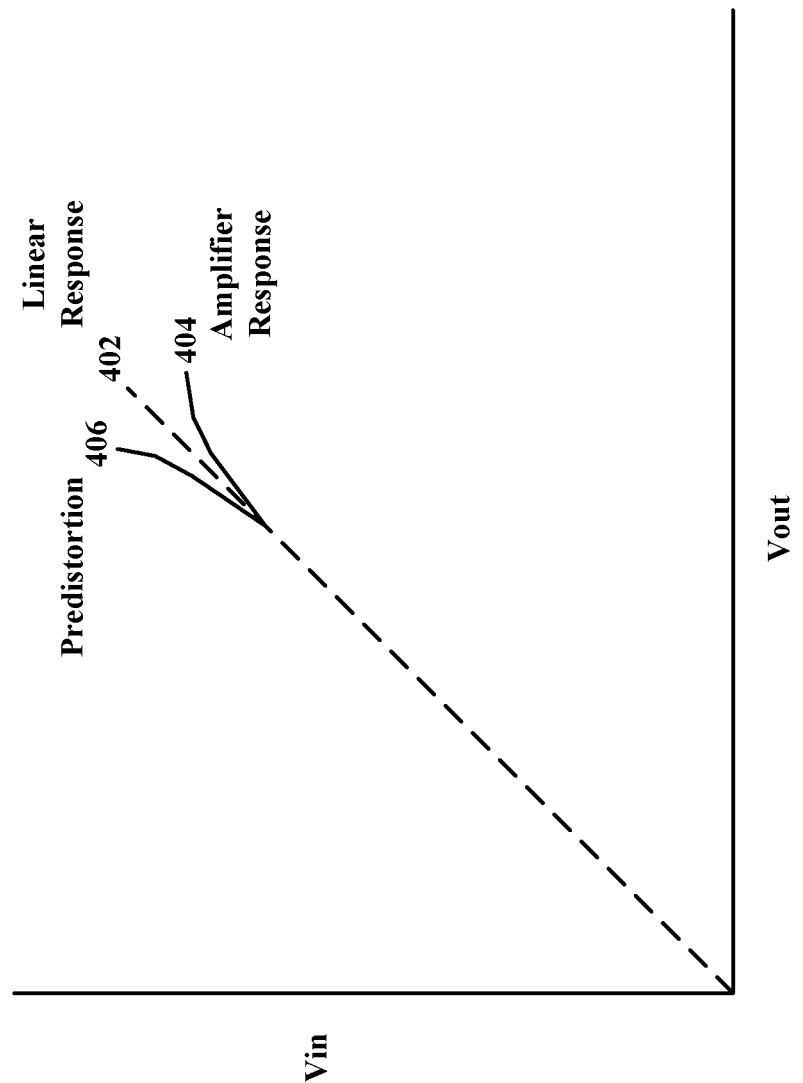
FIG. 4 is a diagram illustrating example DPD.

DPD may be used for compensating for non-linearity in various components (e.g., a power amplifier (PA)) of a system, such as a wireless communication system. DPD may be used to improve the overall transmit performance by improving PA operating efficiency by operating closer to saturated output power (PSAT). DPD may also be used for enabling higher error vector magnitude (EVM) at an operating point. The use of DPD may allow for lowering the operating point of the PA, which may reduce the overall power consumption of the communication system. FIG. 4 is a diagram 400 illustrating example DPD. As illustrated in FIG. 4, an amplifier response 404 may experience drop off at higher output. To compensate for the drop-off, predistortion 406 may be applied so that a more linear response 402 may be achieved. With a more linear response, the PA may more accurately reproduce the signal present at the input. In addition, a PA that has a more non-linear input/output relationship may cause the output signal to splatter onto adjacent radio frequencies, potentially causing interference. DPD may be used for reducing such potential interference.

To implement DPD, information of the PA response may be used. Such information of the PA response may be acquired by training (which may also be referred to as "calibration"). In some instances, such training may be offline. For example, DPD training may be performed in a factory at a time of manufacture and used subsequently. However, such offline training may not take operating conditions into account. A PA's response may change due to temperature, aging, or the like. Online training that take account for PA aging, such as PA model variation due to operating conditions such as temperature, may also be performed. Such online training may yield a better performing DPD compared to offline training. However, to enable online DPD training, DPD training may be performed in a band at a power level comparable to an operational power level. Online DPD training may measure a PA output based on a transmitted training signal.

In some wireless communication systems, the PA output for an antenna port may be conductively coupled to the receive path (e.g., a feedback receiver) for performing measurements. For FR2, antenna arrays may be used to perform beamforming where each port drives multiple antenna elements which may each perform beamforming. Each element may have its own PA. DPD training for such antenna arrays may be subject to routing challenges from many PAs to feedback Rx path(s) and may experience beamforming effects. In addition, when analog beamforming is used, a single DPD module may be used to train multiple PAs and DPD compensation may be performed on the super-position of a set of transmit PAs. As one example, mmW systems may use OTA coupling (mutual coupling) to transmit from one set of elements (PAs) to another nearby element configured for feedback reception. In some aspects, training may be performed on a single layer at a time with one layer being configured for Tx and the other layer configured for Rx. Because coupling may be over-the-air (OTA), there may be no means of containing the emissions when the Tx is enabled, potentially causing the training signal to interfere with wireless communications of other devices. Aspects provided herein may enable a UE or a base station to perform DPD training without interfering with other devices.

Figure 5:
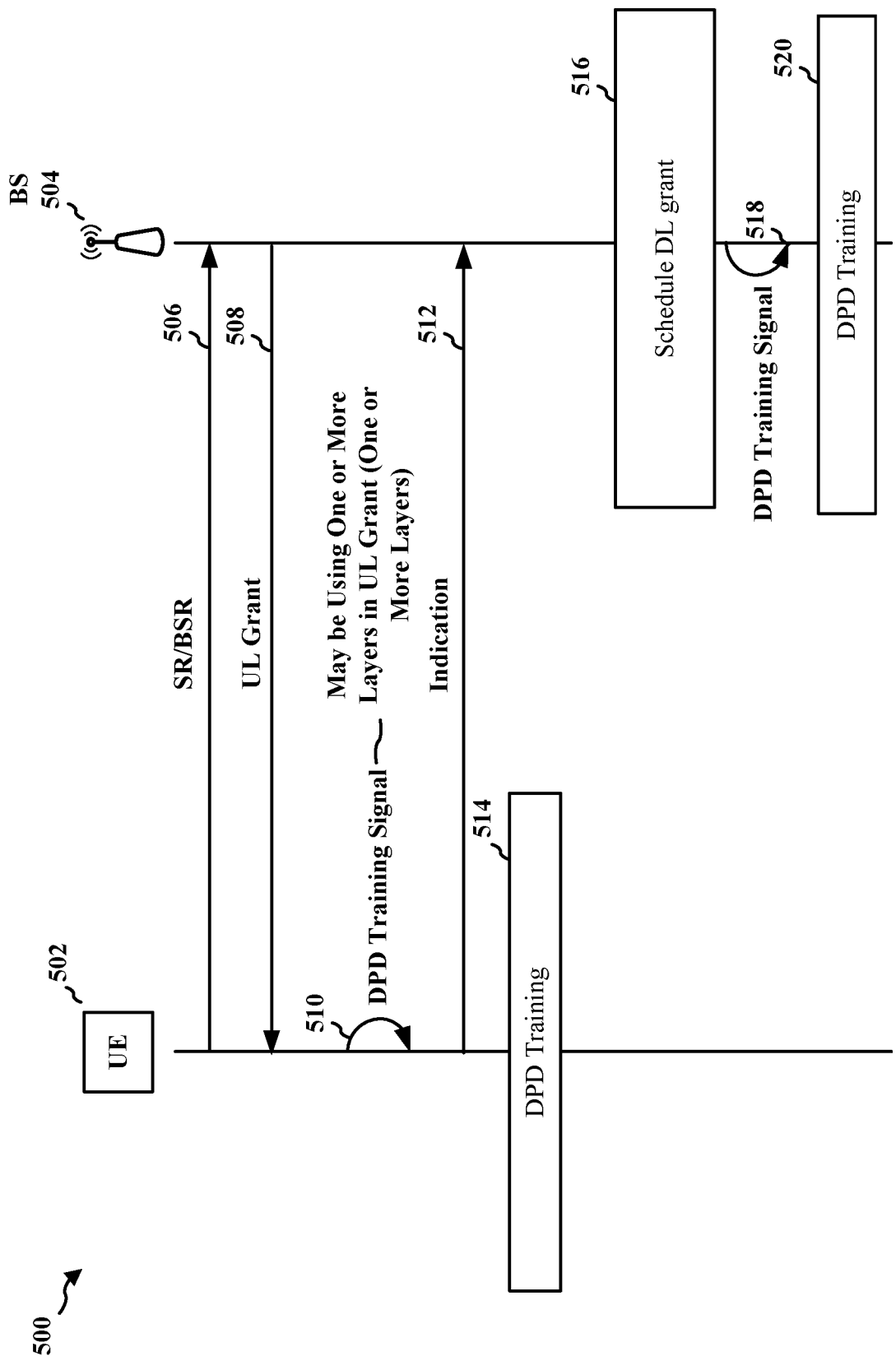
FIG. 5 is a diagram illustrating example communications for DPD calibration.

FIG. 5 is a diagram 500 illustrating example communications for DPD calibration. Referring to FIG. 5, a UE 502 may perform online DPD training one layer (e.g., a MIMO layer) at a time. To avoid interfering with other transmissions in the network, the UE 502 may use one or more resources indicated by an UL grant 508 transmitted by the network (e.g., the base station 504) to transmit a DPD training signal 510. In some aspects, the UE may leverage the UL grant 508 (use resources indicated in the UL grant 508) from the network (e.g., the base station 504) to transmit a DPD training signal 510 on the layer to be trained while configuring a second port for a feedback Rx operation. In some aspects, upon receiving the DPD training signal at the second port, the UE 502 may perform DPD training at 514 by determining (e.g., identifying) one or more DPD parameters, such as a response of a PA.

In some aspects, the DPD training signal 510 may be defined. In some aspects, the DPD training signal 510 may be defined to be within one or more bounds, such as a length in time, a bandwidth, or the like.

In some aspects, the UL grant 508 may be a single-layer grant. If the UL grant 508 is a single-layer grant, the UE 502 may use the single layer resources indicated in the UL grant 508 to transmit on the layer to be trained while configuring a second port for feedback Rx operation. A single-layer grant may grant resources associated with one transmission layer (corresponding with one antenna port) of the UE.

In some aspects, the UL grant 508 may be a double/multi-layer grant. A double/multi-layer grant may grant resources associated with at least two transmission layers (corresponding with at least two antenna ports) of the UE. The resources may be spatially multiplexed or multiplexed in another fashion. In some aspects, if the UL grant 508 is a double/multi-layer grant, the UE 502 may use resources corresponding to one layer indicated in the double/multi-layer UL grant 508 to transmit on the layer to be trained while configuring a second port for feedback Rx operation. Resources corresponding to the unused layer(s) in the double/multi-layer UL grant 508 may be dropped (e.g., not used).

In some aspects, the UE 502 may transmit an indication 512 to the base station 504 to indicate to the network that the resources corresponding to the unused layer in the double layer UL grant 508 are dropped (e.g., unused). In some aspects, the indication 512 may further indicate that the DPD training signal 510 was transmitted.

In some aspects, the UE 502 may transmit a scheduling request (SR) or buffer status reporting (BSR) 506 so that the base station 504 may transmit an UL grant in response to the SR or BSR 506. By transmitting the SR or BSR 506, the UE 502 may trigger the base station 504 to transmit the UL grant 508, thus enabling the DPD training.

For a base station 504 to perform DPD that may train one MIMO layer at a time, the base station 504 may transmit a single layer DPD training signal 518 and configure the second port for feedback reception to capture the waveform upon receiving the DPD training signal 518.

The base station may schedule the DPD training signal as a DL grant associated with a virtual UE. The virtual UE may be based on a configuration associated with the base station 504. For example, a duration, a power level, or a modulation scheme associated with the base station 504 may be used for the virtual UE. In some aspects, the second port of the base station 504 may capture the transmitted DPD training signal 518 and perform processing (e.g., DPD training) to determine one or more DPD parameters at 520. The one or more DPD parameters may include one or more responses of one or more PAs, or the like.

Figure 6:
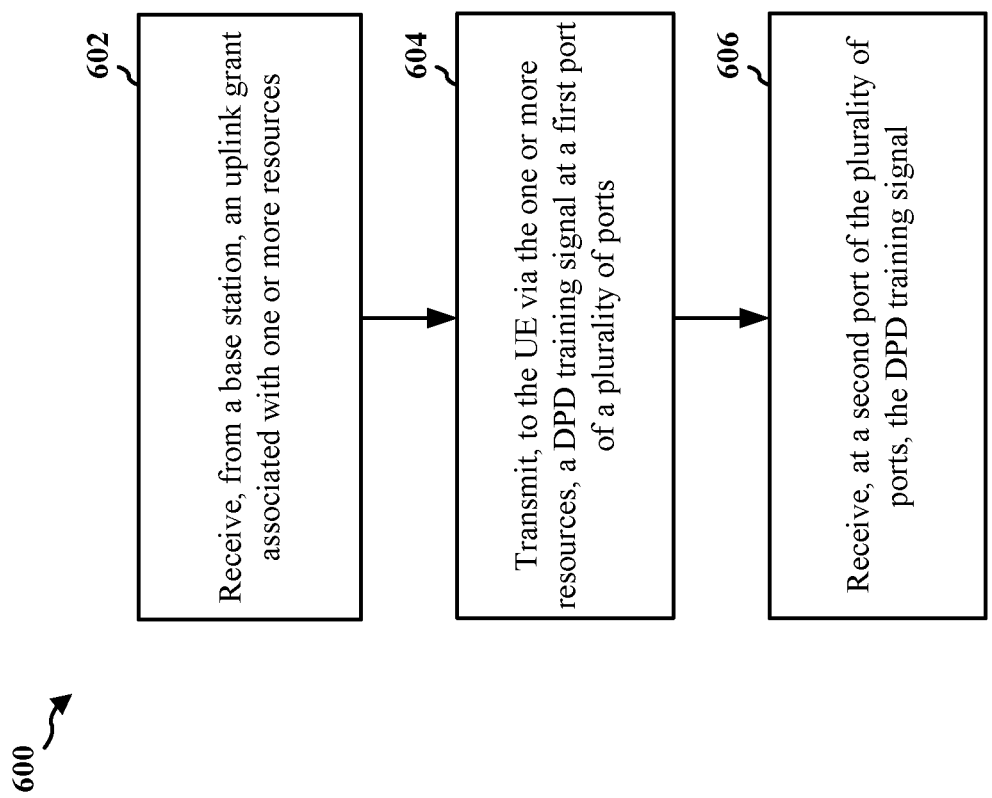
FIG. 6 is a flowchart of a method of wireless communication.

FIG. 6 is a flowchart 600 of a method of wireless communication. The method may be performed by a UE (e.g., the UE 104, the UE 502; the apparatus 802).

At 602, the UE may receive, from a base station, an uplink grant associated with one or more resources. For example, the UE 502 may receive, from a base station 504, an uplink grant 508 associated with one or more resources. In some aspects, 602 may be performed by calibration component 842 in FIG. 8. In some aspects, the uplink grant may be a single-layer grant. In some aspects, the uplink grant may be a multi-layer grant. In some aspects, the UE 502 may transmit, to the base station 504, a SR or BSR 506, where the SR may request the uplink grant. The uplink grant may be based on the BSR.

At 604, the UE may transmit, to the UE via the one or more resources, a DPD training signal at a first port of a plurality of ports. For example, the UE 502 may transmit, to the UE 502 via the one or more resources, a DPD training signal 510 at a first port of a plurality of ports (e.g., MIMO layers). In some aspects, 602 may be performed by calibration component 842 in FIG. 8. In some aspects, to transmit the DPD training signal, the UE 502 may configure one layer of the multi-layer grant or a plurality of layers of the multi-layer grant to transmit the DPD training signal. In some aspects, the UE 502 may transmit, to the base station 504, an indication (e.g., 512) of one or more layers of the multi-layer grant. The one or more layers may be not used for transmission. In some aspects, the indication may further include information related to the DPD training signal. In some aspects, the plurality of ports may be all ports of the UE.

At 606, the UE may receive, at a second port of the plurality of ports, the DPD training signal. For example, the UE 502 may receive, at a second port of the plurality of ports, the DPD training signal 510. In some aspects, 602 may be performed by calibration component 842 in FIG. 8. In some aspects, the DPD training signal may be received via the one or more resources. In some aspects, the UE 502 may determine (e.g., identify) one or more DPD parameters based on the DPD training signal (e.g., at 514). In some aspects, the first port and the second port may be different ports of the UE. In some aspects, the first port or the second port may be ports to be trained using the DPD training signal.

Figure 7:
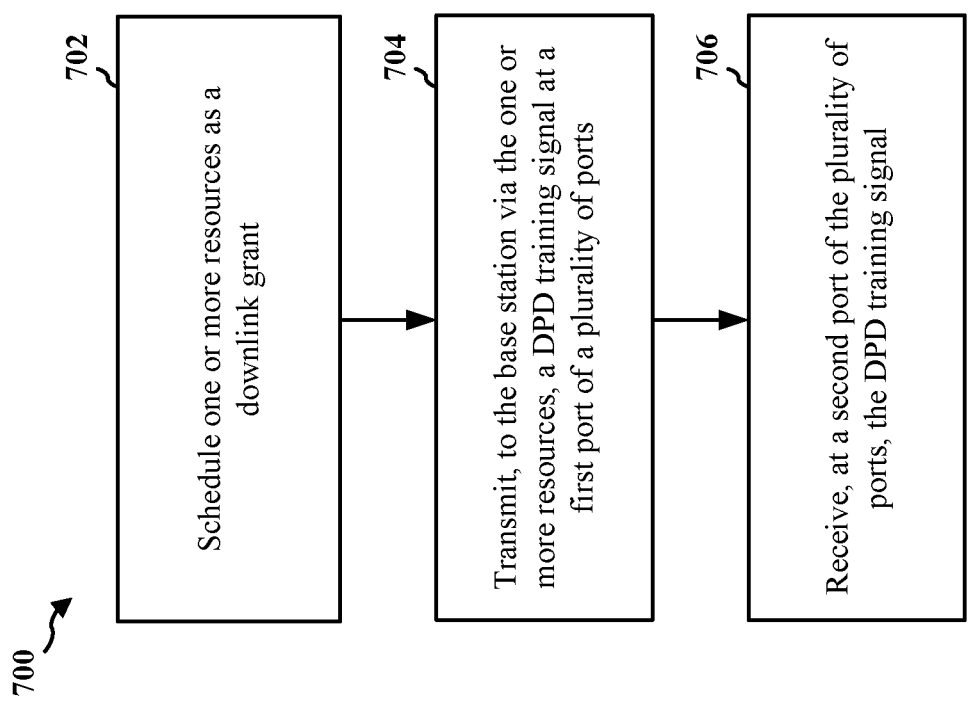
FIG. 7 is a flowchart of a method of wireless communication.

FIG. 7 is a flowchart 700 of a method of wireless communication. The method may be performed by a base station (e.g., the base station 102/180, the base station 504; the apparatus 902).

At 702, the base station may schedule one or more resources as a downlink grant. For example, the base station 504 may schedule one or more resources as a downlink grant (e.g., at 516). In some aspects, 702 may be performed by calibration component 942 in FIG. 9. In some aspects, the downlink grant may be associated with a virtual UE associated with the base station. In some aspects, the virtual UE may be associated with a power level and a modulation scheme. In some aspects, the downlink grant may be not transmitted by the base station.

At 704, the base station may transmit, to the base station via the one or more resources, a DPD training signal at a first port of a plurality of ports. For example, the base station 504 may transmit, to the base station 504 via the one or more resources, a DPD training signal 518 at a first port of a plurality of ports (e.g., MIMO layers). In some aspects, 704 may be performed by calibration component 942 in FIG. 9.

At 706, the base station may receive, at a second port of the plurality of ports, the DPD training signal. For example, the base station 504 may receive, at a second port of the plurality of ports, the DPD training signal 518. In some aspects, 706 may be performed by calibration component 942 in FIG. 9. In some aspects, the DPD training signal may be received via the one or more resources. In some aspects, the base station may identify one or more DPD parameters based on the DPD training signal (e.g., at 520).

Figure 8:
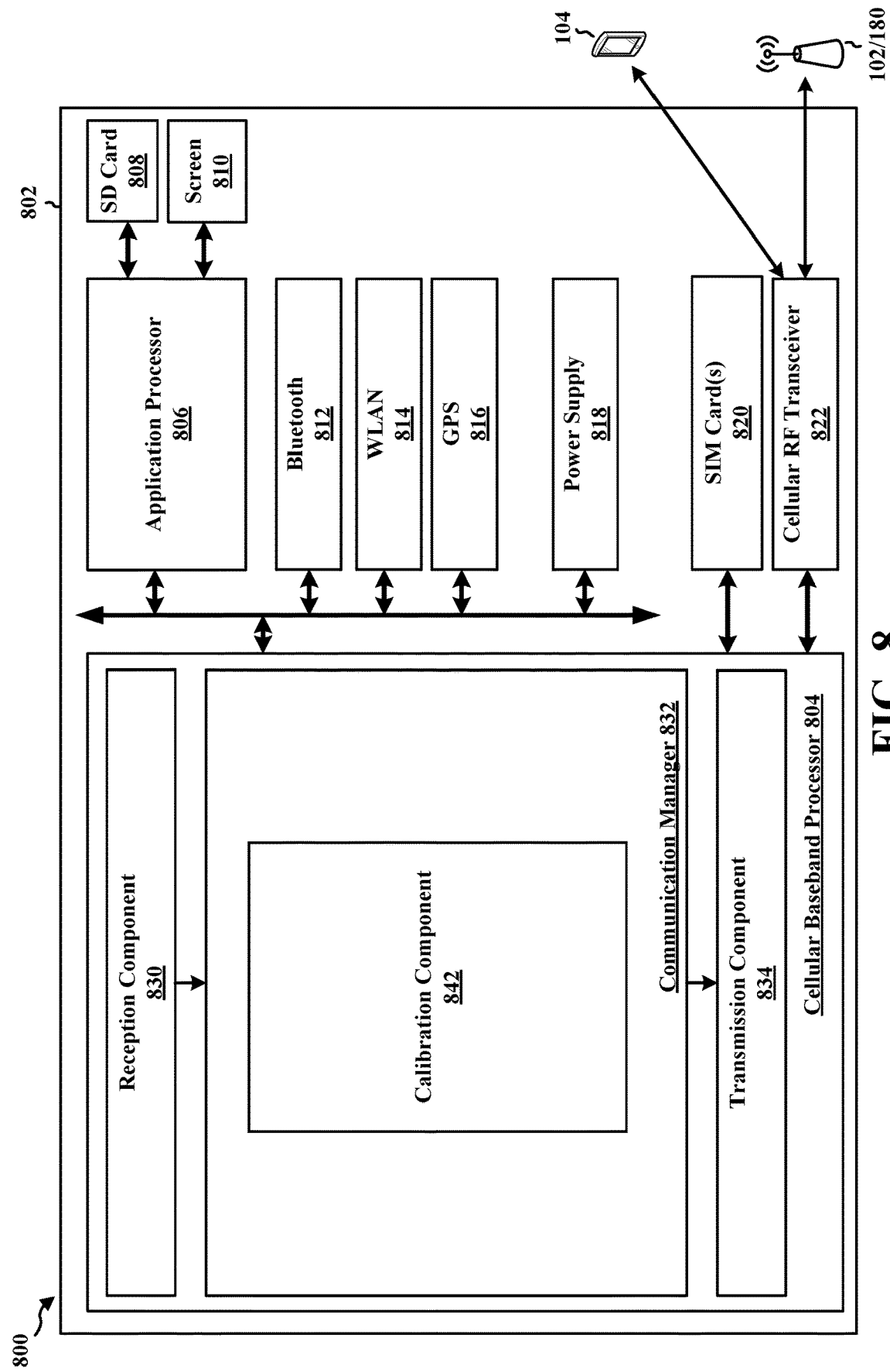
FIG. 8 is a diagram illustrating an example of a hardware implementation for an example apparatus.

FIG. 8 is a diagram 800 illustrating an example of a hardware implementation for an apparatus 802. The apparatus 802 may be a UE, a component of a UE, or may implement UE functionality. In some aspects, the apparatus 802 may include a cellular baseband processor 804 (also referred to as a modem) coupled to a cellular RF transceiver 822. In some aspects, the apparatus 802 may further include one or more subscriber identity modules (SIM) cards 820, an application processor 806 coupled to a secure digital (SD) card 808 and a screen 810, a Bluetooth module 812, a wireless local area network (WLAN) module 814, a Global Positioning System (GPS) module 816, or a power supply 818. The cellular baseband processor 804 communicates through the cellular RF transceiver 822 with the UE 104 and/or BS 102/180. The cellular baseband processor 804 may include a computer-readable medium/memory. The computer-readable medium/memory may be non-transitory. The cellular baseband processor 804 is responsible for general processing, including the execution of software stored on the computer-readable medium/memory. The software, when executed by the cellular baseband processor 804, causes the cellular baseband processor 804 to perform the various functions described supra. The computer-readable medium/memory may also be used for storing data that is manipulated by the cellular baseband processor 804 when executing software. The cellular baseband processor 804 further includes a reception component 830, a communication manager 832, and a transmission component 834. The communication manager 832 includes the one or more illustrated components. The components within the communication manager 832 may be stored in the computer-readable medium/memory and/or configured as hardware within the cellular baseband processor 804. The cellular baseband processor 804 may be a component of the UE 350 and may include the memory 360 and/or at least one of the TX processor 368, the RX processor 356, and the controller/processor 359. In one configuration, the apparatus 802 may be a modem chip and include just the baseband processor 804, and in another configuration, the apparatus 802 may be the entire UE (e.g., see 350 of FIG. 3) and include the additional modules of the apparatus 802.

The communication manager 832 may include a calibration component 842 that is configured to receive, from a base station, an uplink grant associated with one or more resources, e.g., as described in connection with 602 in FIG. 6. The calibration component 842 may be further configured to transmit, to the UE via the one or more resources, a DPD training signal at a first port of a plurality of ports, e.g., as described in connection with 604 in FIG. 6. The calibration component 842 may be further configured to receive, at a second port of the plurality of ports, the DPD training signal, e.g., as described in connection with 606 in FIG. 6.

The apparatus may include additional components that perform each of the blocks of the algorithm in the flowchart of FIG. 6. As such, each block in the flowchart of FIG. 6 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

As shown, the apparatus 802 may include a variety of components configured for various functions. In one configuration, the apparatus 802, and in particular the cellular baseband processor 804, may include means for receiving, from a base station, an uplink grant associated with one or more resources. The cellular baseband processor 804 may further include means for transmitting, to the UE via the one or more resources, a DPD training signal at a first port of a plurality of ports. The cellular baseband processor 804 may further include means for receiving, at a second port of the plurality of ports, the DPD training signal. The cellular baseband processor 804 may further include means for configuring one layer of the multi-layer grant or a plurality of layers of the multi-layer grant to transmit the DPD training signal. The cellular baseband processor 804 may further include means for transmitting, to the base station, an indication of one or more layers of the multi-layer grant, where the one or more layers are not used for transmission. The cellular baseband processor 804 may further include means for transmitting, to the base station, an SR to request the uplink grant. The cellular baseband processor 804 may further include means for transmitting, to the base station, a BSR. The cellular baseband processor 804 may further include means for identifying one or more DPD parameters based on the DPD training signal. The means may be one or more of the components of the apparatus 802 configured to perform the functions recited by the means. As described supra, the apparatus 802 may include the TX Processor 368, the RX Processor 356, and the controller/processor 359. As such, in one configuration, the means may be the TX Processor 368, the RX Processor 356, and the controller/processor 359 configured to perform the functions recited by the means.

Figure 9:
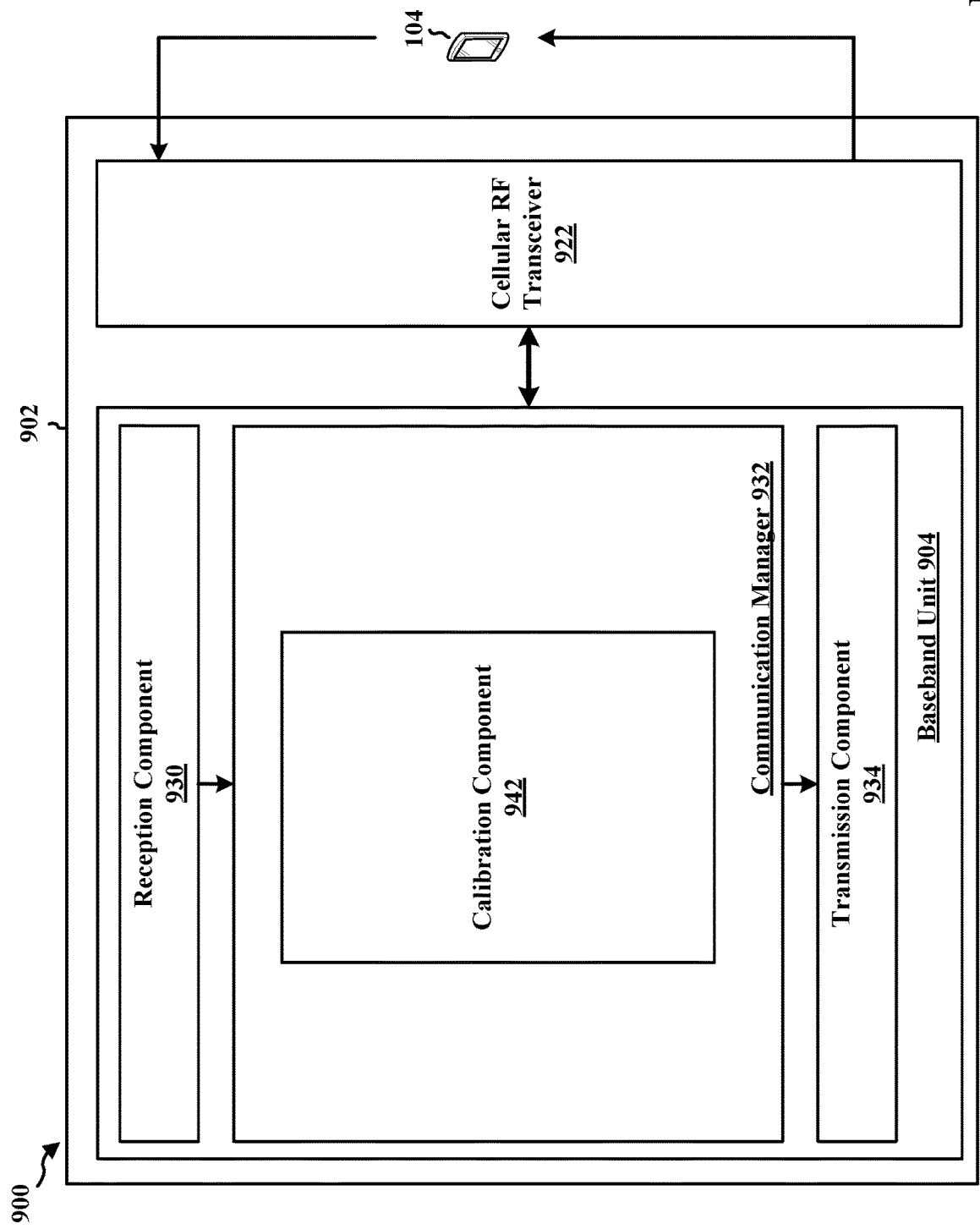
FIG. 9 is a diagram illustrating an example of a hardware implementation for an example apparatus.

FIG. 9 is a diagram 900 illustrating an example of a hardware implementation for an apparatus 902. The apparatus 902 may be a base station, a component of a base station, or may implement base station functionality. In some aspects, the apparatus 802 may include a baseband unit 904. The baseband unit 904 may communicate through a cellular RF transceiver 922 with the UE 104. The baseband unit 904 may include a computer-readable medium/memory. The baseband unit 904 is responsible for general processing, including the execution of software stored on the computer-readable medium/memory. The software, when executed by the baseband unit 904, causes the baseband unit 904 to perform the various functions described supra. The computer-readable medium/memory may also be used for storing data that is manipulated by the baseband unit 904 when executing software. The baseband unit 904 further includes a reception component 930, a communication manager 932, and a transmission component 934. The communication manager 932 includes the one or more illustrated components. The components within the communication manager 932 may be stored in the computer-readable medium/memory and/or configured as hardware within the baseband unit 904. The baseband unit 904 may be a component of the base station 310 and may include the memory 376 and/or at least one of the TX processor 316, the RX processor 370, and the controller/processor 375.

The communication manager 932 may include a calibration component 942 that is configured to schedule one or more resources as a downlink grant, e.g., as described in connection with 702 in FIG. 7. The calibration component 942 may be further configured to transmit, to the base station via the one or more resources, a DPD training signal at a first port of a plurality of ports, e.g., as described in connection with 704 in FIG. 7. The calibration component 942 may be further configured to receive, at a second port of the plurality of ports, the DPD training signal, e.g., as described in connection with 706 in FIG. 7.

The apparatus may include additional components that perform each of the blocks of the algorithm in the flowchart of FIG. 7. As such, each block in the flowchart of FIG. 7 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

As shown, the apparatus 902 may include a variety of components configured for various functions. In one configuration, the apparatus 902, and in particular the baseband unit 904, may include means for scheduling one or more resources as a downlink grant. The baseband unit 904 may further include means for transmitting, to the base station via the one or more resources, a DPD training signal at a first port of a plurality of ports. The baseband unit 904 may further include means for receiving, at a second port of the plurality of ports, the DPD training signal. The baseband unit 904 may further include means for identifying one or more DPD parameters based on the DPD training signal. The means may be one or more of the components of the apparatus 902 configured to perform the functions recited by the means. As described supra, the apparatus 902 may include the TX Processor 316, the RX Processor 370, and the controller/processor 375. As such, in one configuration, the means may be the TX Processor 316, the RX Processor 370, and the controller/processor 375 configured to perform the functions recited by the means.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Terms such as "if," "when," and "while" should be interpreted to mean "under the condition that" rather than imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The following aspects are illustrative only and may be combined with other aspects or teachings described herein, without limitation.

Aspect 1 is an apparatus for wireless communication at a UE, comprising: a memory; and at least one processor coupled to the memory and configured to: receive, from a base station, an uplink grant associated with one or more resources; transmit, to the UE via the one or more resources, a DPD training signal at a first port of a plurality of ports; and receive, at a second port of the plurality of ports, the DPD training signal.

Aspect 2 is the apparatus of aspect 1, wherein the uplink grant is a single-layer grant.

Aspect 3 is the apparatus of any of aspects 1-2, wherein the uplink grant is a multi-layer grant, and wherein to transmit the DPD training signal, the at least one processor is further configured to: configure one layer of the multi-layer grant or a plurality of layers of the multi-layer grant to transmit the DPD training signal.

Aspect 4 is the apparatus of any of aspects 1-3, wherein the at least one processor is further configured to: transmit, to the base station, an indication of one or more layers of the multi-layer grant, wherein the one or more layers are not used for transmission.

Aspect 5 is the apparatus of any of aspects 1-4, wherein the indication further comprises information related to the DPD training signal.

Aspect 6 is the apparatus of any of aspects 1-5, wherein the at least one processor is further configured to: transmit, to the base station, a SR to request the uplink grant.

Aspect 7 is the apparatus of any of aspects 1-6, wherein the at least one processor is further configured to: transmit, to the base station, a BSR, wherein the uplink grant is based on the BSR.

Aspect 8 is the apparatus of any of aspects 1-7, wherein the at least one processor is further configured to: identify one or more DPD parameters based on the DPD training signal.

Aspect 9 is the apparatus of any of aspects 1-8, wherein the DPD training signal is received via the one or more resources.

Aspect 10 is the apparatus of any of aspects 1-9, further comprising a transceiver coupled to the at least one processor.

Aspect 11 is an apparatus for wireless communication at a base station, comprising: a memory; and at least one processor coupled to the memory and configured to: schedule one or more resources as a downlink grant; transmit, to the base station via the one or more resources, a DPD training signal at a first port of a plurality of ports; and receive, at a second port of the plurality of ports, the DPD training signal.

Aspect 12 is the apparatus of aspect 11, wherein the downlink grant is associated with a virtual UE associated with the base station.

Aspect 13 is the apparatus of any of aspects 11-12, wherein the virtual UE is associated with a power level and a modulation scheme.

Aspect 14 is the apparatus of any of aspects 11-13, wherein the one or more resources are associated with a transmission duration of the virtual UE.

Aspect 15 is the apparatus of any of aspects 11-14, wherein the downlink grant is not transmitted by the base station.

Aspect 16 is the apparatus of any of aspects 11-15, wherein the at least one processor is further configured to: identify one or more DPD parameters based on the DPD training signal.

Aspect 17 is the apparatus of any of aspects 11-16, wherein the DPD training signal is transmitted via the one or more resources.

Aspect 18 is the apparatus of any of aspects 11-17, further comprising a transceiver coupled to the at least one processor.

Aspect 19 is a method of wireless communication for implementing any of aspects 1 to 10.

Aspect 20 is an apparatus for wireless communication including means for implementing any of aspects 1 to 10.

Aspect 21 is a computer-readable medium storing computer executable code, where the code when executed by a processor causes the processor to implement any of aspects 1 to 10.

Aspect 22 is a method of wireless communication for implementing any of aspects 11 to 18.

Aspect 23 is an apparatus for wireless communication including means for implementing any of aspects 11 to 18.

Aspect 24 is a computer-readable medium storing computer executable code, where the code when executed by a processor causes the processor to implement any of aspects 11 to 18.

What is claimed is:

1. An apparatus for wireless communication at a user equipment (UE), comprising:
    a memory; and
    at least one processor coupled to the memory and configured to:
        receive, from a base station, an uplink grant associated with one or more resources;
        transmit, to the UE via the one or more resources, a digital pre-distortion (DPD) training signal at a first port of a plurality of ports; and
        receive, at a second port of the plurality of ports, the DPD training signal.

2. The apparatus of claim 1, wherein the uplink grant is a single-layer grant.

3. The apparatus of claim 1, wherein the uplink grant is a multi-layer grant, and wherein to transmit the DPD training signal, the at least one processor is further configured to:
    configure one layer of the multi-layer grant or a plurality of layers of the multi-layer grant to transmit the DPD training signal.

4. The apparatus of claim 3, wherein the at least one processor is further configured to:
    transmit, to the base station, an indication of one or more layers of the multi-layer grant, wherein the one or more layers are not used for transmission.

5. The apparatus of claim 4, wherein the indication further comprises information related to the DPD training signal.

6. The apparatus of claim 1, wherein the at least one processor is further configured to:
    transmit, to the base station, a scheduling request (SR) to request the uplink grant.

7. The apparatus of claim 1, wherein the at least one processor is further configured to:
    transmit, to the base station, a buffer status reporting (BSR), wherein the uplink grant is based on the BSR.

8. The apparatus of claim 1, wherein the at least one processor is further configured to:
    identify one or more DPD parameters based on the DPD training signal.

9. The apparatus of claim 1, wherein the DPD training signal is received via the one or more resources.

10. The apparatus of claim 1, further comprising a transceiver coupled to the at least one processor.

11. An apparatus for wireless communication at a base station, comprising:
 a memory; and
 at least one processor coupled to the memory and configured to:
  schedule one or more resources as a downlink grant;
  transmit, to the base station via the one or more resources, a digital pre-distortion (DPD) training signal at a first port of a plurality of ports; and
  receive, at a second port of the plurality of ports, the DPD training signal.

12. The apparatus of claim 11, wherein the downlink grant is associated with a virtual user equipment (UE) associated with the base station.

13. The apparatus of claim 12, wherein the virtual UE is associated with a power level and a modulation scheme.

14. The apparatus of claim 12, wherein the one or more resources are associated with a transmission duration of the virtual UE.

15. The apparatus of claim 12, wherein the downlink grant is not transmitted by the base station.

16. The apparatus of claim 11, wherein the at least one processor is further configured to:
 identify one or more DPD parameters based on the DPD training signal.

17. The apparatus of claim 11, wherein the DPD training signal is transmitted via the one or more resources.

18. The apparatus of claim 11, further comprising a transceiver coupled to the at least one processor.

19. A method for wireless communication at a user equipment (UE), comprising:
 receiving, from a base station, an uplink grant associated with one or more resources;
 transmitting, to the UE via the one or more resources, a digital pre-distortion (DPD) training signal at a first port of a plurality of ports; and
 receiving, at a second port of the plurality of ports, the DPD training signal.

20. The method of claim 19, wherein the uplink grant is a single-layer grant.

21. The method of claim 19, wherein the uplink grant is a multi-layer grant, and further comprising:
 configuring one layer of the multi-layer grant or a plurality of layers of the multi-layer grant to transmit the DPD training signal.

22. The method of claim 21, further comprising:
 transmitting, to the base station, an indication of one or more layers of the multi-layer grant, wherein the one or more layers are not used for transmission.

23. The method of claim 22, wherein the indication further comprises information related to the DPD training signal.

24. The method of claim 19, further comprising:
 transmitting, to the base station, a scheduling request (SR) to request the uplink grant.

25. The method of claim 19, further comprising:
 transmitting, to the base station, a buffer status reporting (BSR), wherein the uplink grant is based on the BSR.

26. The method of claim 19, further comprising:
 identifying one or more DPD parameters based on the DPD training signal.

27. The method of claim 19, wherein the DPD training signal is transmitted via the one or more resources.

28. A method for wireless communication at a base station, comprising:
 scheduling one or more resources as a downlink grant;
 transmitting, to the base station via the one or more resources, a digital pre-distortion (DPD) training signal at a first port of a plurality of ports; and
 receiving, at a second port of the plurality of ports, the DPD training signal.

29. The method of claim 28, wherein the downlink grant is associated with a virtual user equipment (UE) associated with the base station.

30. The method of claim 29, wherein the virtual UE is associated with a power level and a modulation scheme.

* * * * *